United States Patent
Bedell et al.

(10) Patent No.: US 8,927,318 B2
(45) Date of Patent: Jan. 6, 2015

(54) SPALLING METHODS TO FORM MULTI-JUNCTION PHOTOVOLTAIC STRUCTURE

(75) Inventors: Stephen W. Bedell, Wappingers Falls, NY (US); Devendra K. Sadana, Pleasantville, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 574 days.

(21) Appl. No.: 13/160,067

(22) Filed: Jun. 14, 2011

(65) Prior Publication Data

US 2012/0318334 A1 Dec. 20, 2012

(51) Int. Cl.
| | |
|---|---|
| *H01L 31/0216* | (2014.01) |
| *H01L 21/18* | (2006.01) |
| *H01L 21/02* | (2006.01) |
| *H01L 21/304* | (2006.01) |
| *H01L 31/0687* | (2012.01) |
| *H01L 31/18* | (2006.01) |

(52) U.S. Cl.
CPC ...... *H01L 21/0262* (2013.01); *H01L 21/02532* (2013.01); *H01L 21/02535* (2013.01); *H01L 21/304* (2013.01); *H01L 31/0687* (2013.01); *H01L 31/06875* (2013.01); *H01L 31/1808* (2013.01); *H01L 31/1852* (2013.01); *H01L 31/1892* (2013.01); *Y02E 10/544* (2013.01)
USPC .......................................... 438/64; 136/256

(58) Field of Classification Search
None
See application file for complete search history.

(56) References Cited

U.S. PATENT DOCUMENTS

| 4,227,941 A | 10/1980 | Bozler et al. |
| 4,248,675 A | 2/1981 | Bozler et al. |
| 2006/0185582 A1 * | 8/2006 | Atwater et al. ................ 117/89 |
| 2010/0180945 A1 * | 7/2010 | Henley et al. ................ 136/256 |
| 2010/0311250 A1 | 12/2010 | Bedell et al. |
| 2011/0254052 A1 * | 10/2011 | Kouvetakis et al. ......... 257/190 |

FOREIGN PATENT DOCUMENTS

| CN | 1159071 A | 9/1997 |
| EP | 2330632 A1 | 8/2011 |
| TW | 201017895 A | 5/2010 |
| WO | 2010/024211 A1 | 3/2010 |
| WO | 2010/140371 A1 | 12/2010 |
| WO | 2010014037 A1 | 12/2010 |

OTHER PUBLICATIONS

Moravej, M., et al., "Plasma enhanced chemical vapour deposition of hydrogenated amorphous silicon at atmospheric pressure", Plasma Sources Sci Technol. 13 (2004) pp. 8-14.
GB Search Report dated Mar. 5, 2013 issued in GB1206930.8.
Letter from IBM China which indicates that the date of the issued Office Action is Jun. 19, 2014 in Chinese Patent Application No. 20121195820.

* cited by examiner

*Primary Examiner* — Brett Feeney
*Assistant Examiner* — Pamela E Perkins
(74) *Attorney, Agent, or Firm* — Scully, Scott, Murphy & Presser, P.C.; Louis J. Percello, Esq.

(57) ABSTRACT

A method cleaving a semiconductor material that includes providing a germanium substrate having a germanium and tin alloy layer is present therein. A stressor layer is deposited on a surface of the germanium substrate. A stress from the stressor layer is applied to the germanium substrate, in which the stress cleaves the germanium substrate to provide a cleaved surface. The cleaved surface of the germanium substrate is then selective to the germanium and tin alloy layer of the germanium substrate. In another embodiment, the germanium and tin alloy layer may function as a fracture plane during a spalling method.

19 Claims, 8 Drawing Sheets

SPALLING METHODS TO FORM MULTI-JUNCTION PHOTOVOLTAIC STRUCTURE

BACKGROUND

The present disclosure relates to photovoltaic device manufacturing, and more particularly, to methods for controlling the removal of a surface layer from a substrate utilizing spalling.

A photovoltaic device is a device that converts the energy of incident photons to electromotive force (e.m.f.). Typical photovoltaic devices include solar cells, which are configured to convert the energy in the electromagnetic radiation from the Sun to electrical energy. Multi junction solar cells comprising compound semiconductors may be employed for power generation in space due to their high efficiency and radiation stability. Multi junction solar cells are mainly fabricated on germanium (Ge) substrates due to the inherently strong (IR) absorption property of germanium (Ge). Germanium (Ge) also includes a crystal structure that can be lattice matched to III-V compound semiconductors, which allows for integration of III-V sub cells on a germanium (Ge) substrate. The germanium (Ge) substrate may constitute nearly 50% to 70% of the final cost of the finished solar cell.

There is a trend within the photovoltaic industry to continually minimize the amount of semiconductor material used to fabricate solar cells, while maximizing energy conversion efficiency. The high-cost associated with producing semiconductor materials degrades the cost per Watt metric of a given photovoltaic technology. Also, expensive semiconductor material that is not contributing to energy conversion can be considered waste at the device level.

SUMMARY

In one embodiment, the present disclosure provides a method of cleaving a semiconductor material, such as a germanium substrate, to provide at least one component of a photovoltaic cell. In one embodiment, the method of cleaving a semiconductor material includes providing a germanium substrate, in which a germanium and tin alloy layer is present within the germanium substrate. A stressor layer may be deposited on a surface that is present on the germanium substrate. A stress from the stressor layer may be applied to the germanium substrate, in which the stress cleaves the germanium substrate to provide a cleaved surface. The germanium and tin alloy layer is present between the surface of the germanium substrate that the stressor layer is formed on and the cleaved surface of the germanium substrate. The cleaved surface of the germanium substrate may then be etched selectively to the germanium and tin alloy layer of the germanium substrate. In some embodiments, the above-described method employs the germanium and tin alloy layer as an etch stop to remove the cleaved surface, and remove variation in thickness in the germanium substrate that results from the cleaved surface.

In another embodiment, a method of cleaving a semiconductor material is provided that includes providing a germanium substrate, in which a germanium and tin alloy layer is present within the germanium substrate. The germanium tin alloy layer may be weakened. A stressor layer may be deposited on a surface that is present on the germanium substrate. A stress from the stressor layer is applied to the germanium substrate, in which the stress cleaves the germanium substrate along the germanium and tin alloy layer. In some embodiments, the above-described method employs the germanium and tin alloy layer as a cleave layer to dictate the depth at which the germanium substrate may be spalled.

In another aspect, a photovoltaic device is provided that includes a layer of germanium having a first conductivity and a thickness ranging from 1 micron to 10 microns, wherein the layer of germanium has a variation of thickness across the entire width of the first layer of germanium that is less than 1000 Å. A semiconductor layer is present on the layer of germanium, wherein the semiconductor layer has a second conductivity that is opposite the first conductivity.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
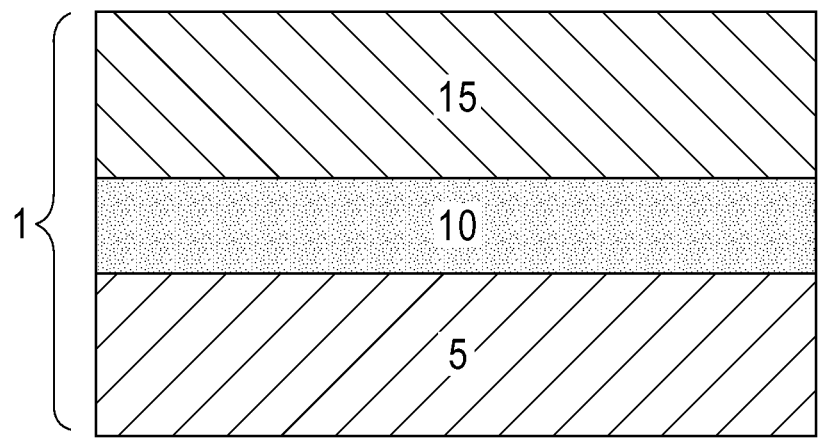
FIG. 1 is a side cross-sectional view depicting a germanium substrate including a germanium and tin alloy layer present therein, as used in one embodiment of a method of forming a photovoltaic device, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "on", "overlying", "atop", "positioned on" or "positioned atop" means that a first element, such as a first structure, is present on a second element, such as a second structure, wherein intervening elements, such as an interface structure, e.g. interface layer, may be present between the first element and the second element. The terms "directly on", "direct contact" means that a first element, such as a first structure, and a second element, such as a second structure, are connected without any intermediary conducting, insulating or semiconductor layers at the interface of the two elements.

The present disclosure relates to using spalling methods in the manufacture of photovoltaic devices, in which the disclosed spalling methods introduce a layer of an alloy of tin and germanium within a germanium substrate in order to further control crack initiation, crack propagation, as well as increase the selectivity of the spalling depths in semiconductor layers, such as germanium (Ge) substrates. As used herein, a "photovoltaic device" is a device, such as a solar cell, that produces free electrons and/or electron vacancies, i.e., holes, when exposed to radiation, such as light, and results in the production of an electric current. The photovoltaic device typically includes layers of p-type conductivity and n-type conductivity that share an interface to provide a heterojunction.

One of the more efficient materials for photovoltaic device applications are III-V compound semiconductor materials, such as gallium arsenide (GaAs). Stacking layers of thin compound semiconductors to provide PN junctions of different compositions (and bandgaps) may provide that a wider portion of the solar spectrum can be captured by a photovoltaic device, which leads to higher efficiency. Germanium may be used as the substrate upon which the compound semiconductor layers, such as III-V compound semiconductors, are grown. Germanium typically serves as the bottom-most junction of the photovoltaic device, and due to its small bandgap, captures the longer wavelength portion of the solar spectrum.

Germanium single crystal substrates are energy intensive to produce, and are expensive. Once a portion of the photovoltaic cell has been formed on a germanium substrate, the portion of the germanium substrate that has been processed to provide a photovoltaic cell may be transferred onto an inexpensive substrate, wherein the portion of the germanium substrate that has not been processed can then be employed in the formation of another photovoltaic cell. Spalling is one method for cleaving the germanium substrate. Spalling includes the deposition of a stress-inducing layer that is deposited on the surface of the germanium substrate that can cleave the germanium substrate by fracture. It has however been determined that the transfer of germanium layers from germanium substrates in the formation of multi junction photovoltaic cells by spalling disadvantageously results in thickness variations in the transferred germanium layer. For example, the thickness variation in the transferred portion of the germanium containing substrate may be on the order of several microns. The variation in the thickness of the transferred portion of the germanium substrate disadvantageously impacts the current matching of the overall multi junction stack that provides the photovoltaic device, as the current produced by each cell should be the same for optimal efficiency. The current will vary with residual germanium layer thickness, the overall efficiency of the cells will likewise vary. The present disclosure provides a method of producing multi junction photovoltaic device structures including a germanium layer, i.e., transferred portion of a germanium substrate, having a controllable and uniform thickness. More specifically and in one embodiment, the method disclosed herein employs a germanium and tin alloy layer, i.e., binary GeSn alloy layer, or a silicon, germanium and tin alloy layer, i.e., ternary SiGeSn alloy layer, to define the final thickness of the residual germanium layer (transferred portion of the germanium substrate).

FIGS. 1-5B depict one embodiment of the present disclosure in which a layer of germanium and tin alloy and/or silicon germanium and tin is used as etch stop to define the residual germanium thickness following spalling. FIG. 1 depicts a germanium substrate 1 including a germanium and tin alloy layer 10. In one embodiment, the germanium substrate 1 may include a material stack that includes, from bottom to top, a first layer of germanium 5, the germanium and tin alloy layer 10 that is present on the first layer of germanium 5, and a second layer of germanium 15 that is present on the germanium and tin alloy layer 10.

In one embodiment, the first layer of germanium 5 may have a germanium content that is greater than 95 atomic (at.) %. In another embodiment, the first layer of germanium 5 may have a germanium content that is greater than 99 at. %. In one example, the first layer of germanium 5 may have a germanium content that is 100 at. %. The first layer of germanium 5 may be formed using a single crystal (monocrystalline) method. One example of a single crystal method for forming the first layer of germanium 5 that provides the germanium substrate is the Czochralski (CZ) method. The Czochralski (CZ) method includes taking a seed of single-crystal germanium and placing it in contact with the top surface of molten germanium. As the seed is slowly raised (or pulled), atoms of the molten germanium solidify in the pattern of the seed and extend the single-crystal structure. The single-crystal structure is then sawn into wafers, i.e., substrates, that can provide the first layer of germanium 5.

The first layer of germanium 5 may be doped to a n-type or p-type conductivity or may be an intrinsic semiconductor layer. An "intrinsic semiconductor layer" is a layer of semiconductor material that is substantially pure, i.e., an intrinsic semiconductor layer is not doped with n-type or p-type dopants. As used herein, "p-type" refers to the addition of impurities to an intrinsic semiconductor that creates deficiencies of valence electrons (i.e. holes). As used herein, "n-type"

refers to the addition of impurities that contributes free electrons to an intrinsic semiconductor. The thickness of the first layer of germanium 5 may range from 50 um to 10 cm. In another embodiment, the thickness of the first layer of germanium 5 may range from 80 um to 1 mm.

It is noted that the above thicknesses for the first layer of germanium 5 have been provided for illustrative purposes only, and are not intended to limit the present disclosure. For example, other thicknesses of the first layer of germanium 5 may be employed, so long as the thickness of the first layer of germanium 5 provides that at least a residual portion of the first layer of germanium 5 remains after spalling, so that the subsequently formed germanium and tin alloy layer 10 is present between the cleaved surface of the first layer of germanium 15 and the subsequently formed second layer of germanium 15.

The germanium and tin alloy layer 10 that provides the etch stop layer, and may include a portion of the bottom cell of the photovoltaic device, may be an epitaxially formed layer that is deposited directly on a surface of the first layer of germanium 5. The terms "epitaxially formed", "epitaxial growth" and/or "epitaxial deposition" means the growth of a semiconductor material on a deposition surface of a semiconductor material, in which the semiconductor material being grown has the same crystalline characteristics as the semiconductor material of the deposition surface. Therefore, in the embodiments in which the first layer of germanium 5 has a single crystal crystalline structure, the epitaxially grown germanium and tin alloy layer 10 also has a single crystal crystalline structure. Further, in the embodiments in which the first layer of germanium 5 has a polycrystalline structure, the epitaxially grown germanium and tin alloy layer 10 will also have a polycrystalline structure.

The germanium and tin alloy layer 10 may be composed of 0.5% at. to 20 at. % tin, and a remainder of germanium. In another embodiment, the germanium and tin alloy layer 10 may be composed of 5 at. % to 20 at. % tin, and 80 at. % to 95 at. % germanium. In yet another embodiment, the germanium and tin alloy layer 10 may be composed of 10 at. % to 15 at. % tin and 85 at. % to 90 at. % germanium. It is noted that the above concentrations have been provided for illustrative purposes only, and are not intended to limit the present disclosure. For example, other concentrations of tin may be employed, so long as the concentration of tin is great enough so that the first layer of germanium 5 may be etched selectively to the germanium and tin alloy layer 10.

In another embodiment, the germanium and tin alloy layer 10 may further include silicon, wherein the silicon is introduced to offset the stress that is introduced by tin. More specifically, tin increases the lattice dimension of the epitaxially grown germanium and tin alloy layer 10 so that it is larger than the lattice dimension of the first layer of germanium 5. Therefore, with increasing tin concentration in the germanium and tin alloy layer 10, the compressive stress that is present in the germanium and tin alloy layer 10 is increased. The introduction of stress within the germanium and tin alloy layer 10 may result in defect formation. To reduce the compressive strain, silicon may be introduced to the germanium and tin alloy layer 10 to reduce the lattice dimension of the epitaxially grown germanium and tin alloy layer 10. More specifically, in one embodiment, the germanium and tin alloy layer 10 may be composed of 0.5% at. to 20 at. % tin, less than 50 at. % silicon, and a remainder of germanium. In another embodiment, the germanium and tin alloy layer 10 may be composed of 0% at. to 10 at. % tin 0% to 38 at. % silicon, and 100 at. % to 52 at. % germanium, respectively. If the molar ratio of Si:Sn is approximately 3.8 in the Ge(SiSn) alloy, then the lattice parameter will be the same as bulk Ge. Therefore, these alloys can be grown strain-free on Ge substrates.

It is noted that the above compositions for the germanium and tin alloy layer 10 have been provided for illustrative purposes only, and are not intended to limit the present disclosure. For example, other concentrations of tin may be employed, so long as the concentration of tin is great enough so that the material of the first layer of germanium 5 may be etched selectively to the germanium and tin alloy layer 10.

In one embodiment, the germanium and tin alloy layer 10 may be deposited using molecular beam epitaxial (MBE) deposition. For example, the tin and germanium sources for the MBE deposition of the germanium and tin alloy layer 10 may include solid source materials of tin and germanium. In the embodiments, in which the germanium and tin alloy layer 10 further includes silicon, the sources for the MBE deposition of the germanium and tin alloy layer may include solid source materials of tin, germanium and silicon.

Molecular beam epitaxy (MBE) takes place in vacuum on the order of $10^{-8}$ Pa. In solid-source MBE, the solid source materials, such as tin, germanium and silicon (optional), are heated in separate quasi-effusion cells until they begin to slowly sublimate. The gaseous elements then condense on the deposition surface, i.e., first layer of germanium 5, where they may react with each other. The term "beam" denotes that evaporated atoms do not interact with each other or vacuum chamber gases until they reach the deposition surface, due to the long mean free paths of the atoms.

In another embodiment, the germanium and tin alloy layer 10 may be deposited using chemical vapor deposition. Chemical vapor deposition (CVD) is a deposition process in which a deposited species is formed as a result of a chemical reaction between gaseous reactants and surface of a substrate at room temperature or greater, resulting in deposition of a film on the substrate surface. Variations of CVD processes include, but are not limited to, Atmospheric Pressure CVD (APCVD), Low Pressure CVD (LPCVD), Plasma Enhanced CVD (PECVD), Metal-Organic CVD (MOCVD), Ultra-high vacuum CVD (UHV-CVD) and combinations thereof. Other examples of processes for depositing the germanium-containing silicon layer 3 include atomic layer deposition (ALD), evaporation, chemical solution deposition and other like deposition processes.

A number of different sources may be used for the deposition of the germanium and tin alloy layer 10 by CVD. In some embodiments, the source gasses for epitaxial growth of the germanium and tin alloy layer 10 by CVD includes a germanium source gas, such as germane gas ($GeH_4$), and a tin source gas, such as stannane ($SnH_4$), Stannane-d4 ($SnD_4$) or a combination thereof. In the embodiments in which the germanium and tin alloy layer 10 is composed of silicon in addition to germanium and tin, the source gas for depositing the germanium and tin alloy layer 10 include a germanium source gas, such as germane gas ($GeH_4$), a tin source gas, such as stannane ($SnH_4$), Stannane-d4 ($SnD_4$) or a combination thereof, and a silicon source gas, such as silicon tetrachloride, dichlorosilane ($SiH_2Cl_2$), silane ($SiH_4$), and higher-order silanes such as disilane ($Si_2H_6$) and trisilane ($Si_3H_8$). The temperature for epitaxial deposition typically ranges from 300° C. to 800° C. Although lower temperature growth is generally favored due to the low solubility of Sn in the Ge or GeSi lattice.

The germanium and tin alloy layer 10 may be doped to an n-type or a p-type conductivity or may be an intrinsic semiconductor layer. The dopant that provides the conductivity type of the germanium and tin alloy layer 10 may be deposited in-situ. The term "conductivity type" denotes a p-type or n-type dopant. By "in-situ" it is meant that the dopant that provides the conductivity type of the material layer is introduced as the material layer is being formed or deposited. In one embodiment, when the germanium and tin alloy layer 10 is doped to a p-type conductivity, the source gasses employed during the CVD process may further include a p-type dopant source. For example, diborane ($B_2H_6$) gas can be introduced into the processing chamber concurrently with the source gasses for the tin, germanium and optional silicon. In one embodiment, when the germanium and tin alloy layer is doped to an n-type conductivity, the source gasses employed during the CVD process may further include an n-type dopant source. For example, phosphine ($PH_3$) gas or arsine ($AsH_3$) gas can be introduced into the processing chamber concurrently with the source gasses for the tin, germanium and optional silicon.

The p-type and/or n-type dopant for the germanium and tin alloy layer 10 may also be introduced following the deposition of the germanium and tin alloy layer 10 using at least one of plasma doping, ion implantation, and/or outdiffusion from a disposable diffusion source (e.g., borosilicate glass).

The thickness of the germanium and tin alloy layer 10 may range from 1 nm to 500 nm. In another embodiment, the thickness of the germanium and tin alloy layer 10 may range from 5 nm to 50 nm. It is noted that the above thicknesses for the germanium and tin alloy layer 10 have been provided for illustrative purposes only, and are not intended to limit the present disclosure. For example, other thicknesses for the germanium and tin alloy layer 10 may be employed, so long as the thickness of germanium and tin alloy layer 10 is great enough so that germanium and tin alloy layer 10 may act as an etch stop during etch processes to remove the remaining portion of the first layer of germanium 5 following etching of the cleaved surface 4.

When employed in the lower cell of a photovoltaic device and doped to a p-type conductivity, the concentration of the p-type dopant in the germanium and tin alloy layer 10 ranges from $5 \times 10^{17}$ atoms/cm$^3$ to $5 \times 10^{20}$ atoms/cm$^3$. When employed in the lower cell of a photovoltaic device and doped to an n-type conductivity, the concentration of the n-type dopant in the germanium and tin alloy layer 10 ranges from $5 \times 10^{17}$ atoms/cm$^3$ to $1 \times 10^{20}$ atoms/cm$^3$.

Still referring to FIG. 1 and in one embodiment, a second layer of germanium 15 is present on the germanium and tin alloy layer 10 of the germanium substrate 1. In one embodiment, the second layer of germanium 15 may have a germanium content that is greater than 95 at. %. In another embodiment, the second layer of germanium 15 may have a germanium content that is greater than 99 at. %. In one example, the second layer of germanium 15 may have a germanium content that is 100%. The second layer of germanium 15 may be deposited on the germanium and tin alloy layer 10 using a deposition process, such as CVD. In one embodiment, the CVD process for forming the second layer of germanium 15 is selected from the group consisting of Atmospheric Pressure CVD (APCVD), Low Pressure CVD (LPCVD), Plasma Enhanced CVD (PECVD), Metal-Organic CVD (MOCVD), Ultra-high vacuum CVD (UHV-CVD) and combinations thereof. In one embodiment, the second layer of germanium 15 may be an epitaxially deposited layer, in which the germanium source of the epitaxial deposition process comprises germane ($GeH_4$) gas. It is also contemplated that the second layer of germanium 15 may also contain Sn and Si to improve the performance of the photovoltaic device (e.g., increases absorption ay longer wavelengths compared to pure Ge).

Similar to the germanium and tin alloy layer 10, the second layer of germanium 15 may be doped to a p-type conductivity or an n-type conductivity. The dopant that provides the conductivity type of the second layer of germanium 15 may be introduced in-situ during the forming process that provides the second layer of germanium 15, or the dopant that provides the conductivity type of the second layer of germanium 15 may be introduced using ion implantation or plasma doping after the layer of germanium 15 has been deposited. The thickness of the second layer of germanium 15 may range from 100 nm to 15 um. In another embodiment, the thickness of the second layer of germanium 15 may range from 500 nm to 10 um. In some embodiments, the second layer of germanium 15 may function as a component of the bottom cell of the photovoltaic device.

Figure 2A:
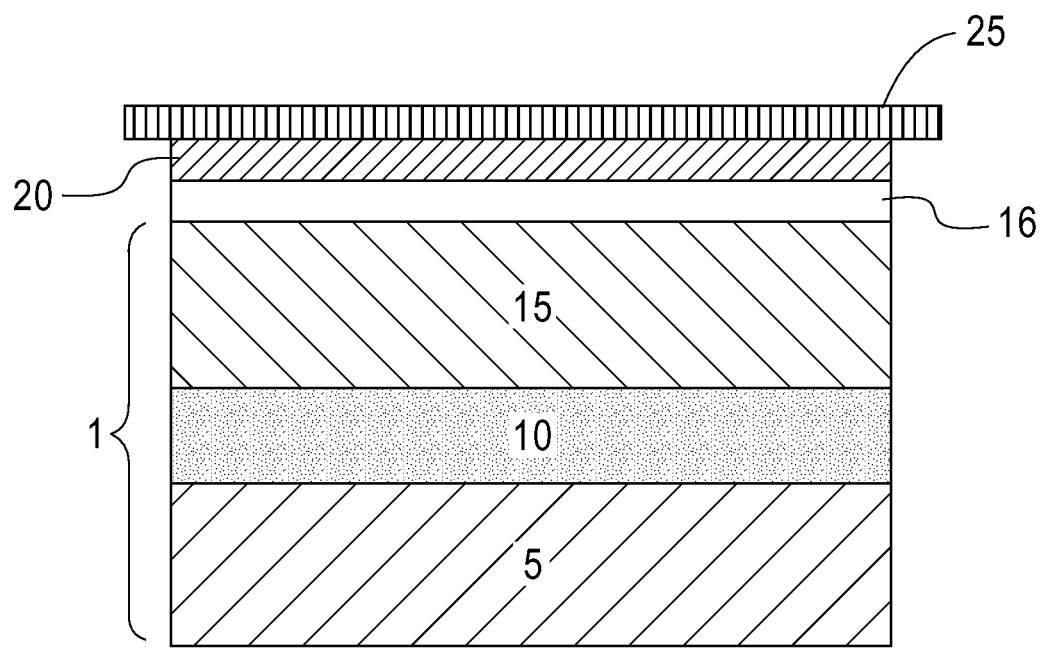
FIG. 2A is a side cross-sectional view depicting depositing a stressor layer directly to a surface of the germanium substrate, in accordance with one embodiment of the present disclosure.
Figure 2B:
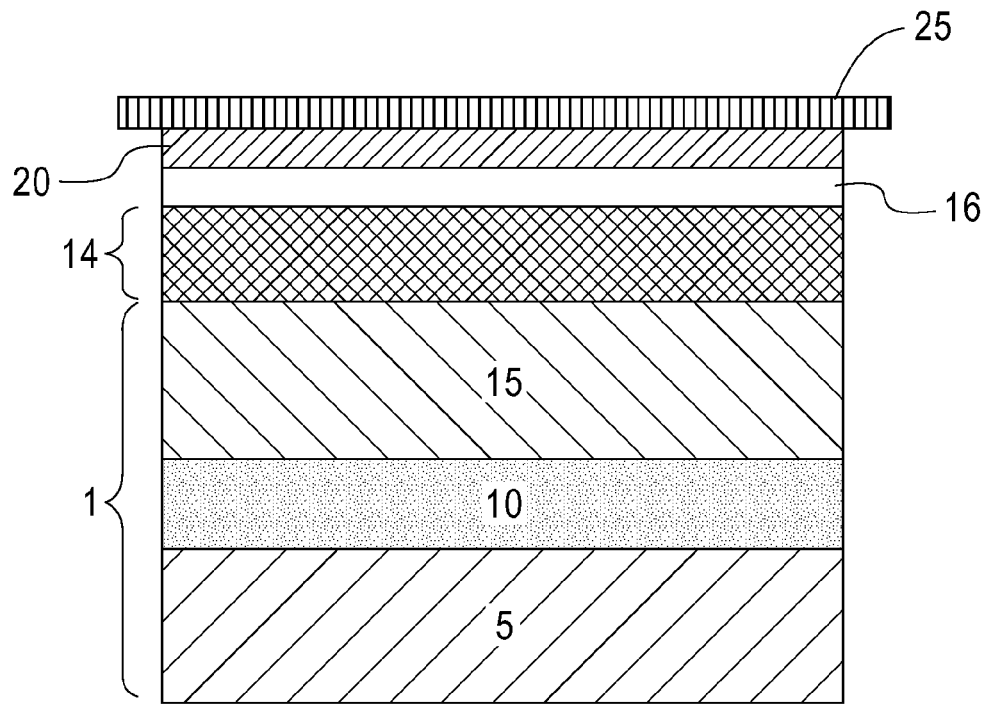
FIG. 2B is a side cross-sectional view depicting depositing at least one of a passivation layer, back surface field layer, tunnel layer and/or III-V solar cell on the germanium substrate prior to depositing the stressor layer, in accordance with one embodiment of the present disclosure.

FIG. 2A depicts one embodiment of depositing a stressor layer 20 directly on a surface of the germanium substrate 1, e.g., directly on the surface of the second layer of germanium 15. FIG. 2B depicts one embodiment of depositing a stressor layer 20 on a back surface material layer 14 that is present on the germanium substrate 1, e.g., is present on the second layer of germanium 15. The back surface material layer 14 may be a single material layer or a multilayered material layer. In one embodiment, the back surface material layer 14 that provides the surface of the germanium substrate 1 may be at least one of a back surface field layer, a passivation layer, a tunnel layer, a back solar cell junction or a combination thereof. The back surface material layer 14 may be provided by any combination of back surface field layers, passivation layers, tunnel layers and back solar cell junctions.

Referring to FIG. 2B, the back surface material layer 14 may be provided by a back surface field region that is formed on a surface of the second layer of germanium 15. A "back surface field (BSF) region" is a doped region having a higher dopant concentration than the second layer of germanium 15. The back surface field region and the second layer of germanium 15 typically have the same conductivity type, e.g., p-type or n-type conductivity. The interface between the highly doped back surface field (BSF) region and the second layer of germanium 15 having a lower dopant concentration than the back surface field (BSF) region behaves like a p-n junction, and an electric field forms at the interface which introduces a barrier to minority carrier flow to the rear surface. The minority carrier concentration is thus maintained at higher levels in the second layer of germanium 15 and the back surface field (BSF) region has a net effect of passivating the rear surface of the solar cell.

Still referring to FIG. 2B, the back surface material layer 14 may also include a passivation layer, which may be present on the back surface field region of the second layer of germanium 15. In another embodiment, the back surface material layer may be omitted, wherein the back surface material layer 14 is a single material layer provided by a passivation layer. The passivation layer is a material layer that is formed on the back surface of the second layer of germanium 15, which provides the lower cell of the subsequently formed photovoltaic cell, wherein the passivation layer reduces the concentration of dangling bonds at the back surface of the bottom cell of the photovoltaic device. In one embodiment, the passivation layer is composed of hydrogenated amorphous silicon (a-Si:H). Typically, the hydrogenated amorphous silicon is an intrinsic semiconductor layer. Deposition of the hydrogenated amorphous silicon containing material by PECVD includes at least one semiconductor material containing reactant gas and at least one hydrogen containing reactant gas. In one embodiment, the semiconductor material containing reactant gas for producing the hydrogenated amorphous silicon containing material includes at least one atom of silicon. For example, to provide the silicon component of the hydrogenated amorphous silicon, the semiconductor material containing reactant gas can include at least one of $SiH_4$, $Si_2H_6$, $SiH_2Cl_2$, $SiHCl_3$, and $SiCl_4$. The hydrogen containing reactant gas for depositing the hydrogenated amorphous silicon containing material by PECVD may be hydrogen gas ($H_2$).

Still referring to FIG. 2B, the back surface material layer 14 may also include a back solar cell junction may be formed on the passivation layer. In another embodiment, the back surface field layer and the passivation layer may be omitted, in which the back surface material layer 14 may be provided by at least one back solar cell junction that is formed on the exposed surface of the second layer of germanium 15. The back solar cell junction may be composed of any number of p/n junctions and may be composed of any number of materials. In one embodiment, the material layers that provide the back solar cell junction may be compound semiconductor materials. Examples of compound semiconductor materials that are suitable for the back solar cell junction include, but are no limited to, aluminum antimonide (AlSb), aluminum arsenide (AlAs), aluminum nitride (AlN), aluminum phosphide (AlP), boron nitride (BN), boron phosphide (BP), boron arsenide (BAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

As mentioned above and as shown in FIGS. 2A and 2B, a stressor layer 20 may be deposited directly on a surface of the germanium substrate 1, as depicted in FIG. 2A, or on a back surface material layer 14 that is present on the germanium substrate 1, as depicted in FIG. 2B. In one embodiment, the stressor layer 20 is composed of a metal containing layer, a polymer layer, an adhesive tape or a combination thereof. In some embodiments of the present disclosure, the surface that the stressor layer 20 is deposited on can be cleaned prior to further processing to remove surface oxides and/or other contaminants therefrom. In one embodiment of the present disclosure, the that the stressor layer 20 is deposited on may be cleaned by applying a solvent such as, for example, acetone and isopropanol.

In some embodiments, an optional metal-containing adhesion layer 16 is formed on a surface of the germanium substrate 1, as depicted in FIG. 2A, or on a surface of the back surface material layer 14, as depicted in FIG. 2B, prior to forming the stressor layer 20. The optional metal-containing adhesion layer 16 is employed in embodiments in which the stressor layer 20 has poor adhesion to the surface on which the stressor layer 20 is to be formed. Typically, the metal-containing adhesion layer 16 is employed when a stressor layer 20 comprised of a metal is employed.

The optional metal-containing adhesion layer 16 employed in the present disclosure includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

The metal-containing adhesion layer 16 may be formed at room temperature (15° C.-40° C.) or above. In one embodiment, the optional metal-containing adhesion layer 16 is formed at a temperature ranging from 20° C. to 180° C. In another embodiment, the optional metal-containing adhesion layer 16 is formed at a temperature that ranges from 20° C. to 60° C.

The metal-containing adhesion layer 16, which may be optionally employed, can be formed utilizing deposition techniques. For example, the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 16 typically has a thickness of from 5 nm to 200 nm, with a thickness of from 100 nm to 150 nm being more typical. Other thicknesses for the optional metal-containing adhesion layer 16 that are below and/or above the aforementioned thickness ranges can also be employed in the present disclosure.

In some embodiments, the stressor layer 20 is formed on an exposed surface of the optional metal-containing adhesion layer 16. In some embodiments in which the optional metal-containing adhesion layer 16 is not present, the stressor layer 20 is formed directly on the germanium substrate 1, or directly on the back surface material layer 14 that is present on the germanium substrate 1. These particular embodiments are not shown in the drawings, but can readily be deduced from the drawings illustrated in the present application.

In one embodiment, the stressor layer 20 that is employed in the present disclosure may include any material that is under tensile stress on germanium substrate 10 at the spalling temperature. Illustrative examples of such materials that are under tensile stress when applied atop the germanium substrate 1 include, but are not limited to, a metal, a polymer, such as a spall inducing tape layer, or any combination thereof. The stressor layer 20 that may comprise a single stressor layer, or a multilayered stressor structure including at least two layers of different stressor material can be employed.

In one embodiment, the stressor layer 20 is a metal, and the metal is formed on an upper surface of the optional metal-containing adhesion layer 16. In another embodiment, the stressor layer 20 is a spall inducing tape, and the spall inducing tape is applied directly to the surface of the germanium substrate 1, as depicted in FIG. 2A, or is applied directly to the back surface material layer 14, as depicted in FIG. 2B. In another embodiment, for example, the stressor layer 20 may comprise a two-part stressor layer including a lower part and an upper part. The upper part of the two-part stressor layer can be comprised of a spall inducing tape layer.

When a metal is employed as the stressor layer 20, the metal can include, for example, Ni, Ti, Cr, Fe or W. Alloys of these, and other, metals can also be employed. In one embodiment, the stressor layer 20 includes at least one layer consisting of Ni. When a polymer is employed as the stressor layer 20, the polymer is a large macromolecule composed of repeating structural units. These subunits are typically connected by covalent chemical bonds. Illustrative examples of polymers that can be employed as the stressor layer 20 include, but are not limited to, polyimides, polyesters, polyolefins, polyacrylates, polyurethane, polyvinyl acetate, and polyvinyl chloride.

When a spall inducing tape layer is employed as the stressor layer 20, the spall inducing tape layer includes any pressure sensitive tape that is flexible, soft, and stress free at the first temperature used to form the tape, yet strong, ductile and tensile at the second temperature used during removal of the upper portion of the base substrate. By "pressure sensitive tape," it is meant an adhesive tape that will stick with application of pressure, without the need for solvent, heat, or water for activation. Tensile stress in the tape is primarily due to thermal expansion mismatch between the first layer of germanium 15 (with a lower thermal coefficient of expansion) of the germanium substrate 1 and the tape (with a higher thermal expansion coefficient).

Typically, the pressure sensitive tape that is employed in the present disclosure as the stressor layer 20 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 20 that is employed in the present disclosure is formed at room temperature (15° C.-40° C.). In another embodiment, when a tape layer is employed, the tape layer can be formed at temperature ranging from 15° C. to 60° C.

When the stressor layer 20 is a metal or polymer, the stressor layer 20 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 20 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 20 include, for example, Nitto Denko 3193MS thermal release tape, Kapton KPT-1, and Diversified Biotech's CLEAR-170 (acrylic adhesive, vinyl base).

In one embodiment, a two-part stressor layer 20 can be formed directly on a surface of the germanium substrate 1, as depicted in FIG. 2A, or can be formed directly on a surface of a back surface material layer 14, as depicted in FIG. 2B, wherein a lower part of the two-part stressor layer 20 is formed at a first temperature, which is at room temperature or slight above (e.g., from 15° C. to 60° C.), wherein an upper part of the two-part stressor layer 20 comprises a spall inducing tape layer at an auxiliary temperature which is at room temperature.

If the stressor layer 20 is of a metallic nature, it typically has a thickness of from 3 µm to with a thickness of from 4 µm to 8 µm being more typical. Other thicknesses for the stressor layer 20 that are below and/or above the aforementioned thickness ranges can also be employed in the present disclosure.

If the stressor layer 20 is of a polymeric nature, it typically has a thickness of from 10 µm to 200 µm, with a thickness of from 50 µm to 100 µm being more typical. Other thicknesses for the stressor layer 20 that are below and/or above the aforementioned thickness ranges can also be employed in the present disclosure.

Still referring to FIGS. 2A and 2B an optional handle substrate 25 can be formed atop the stressor layer 20. The optional handle substrate 25 employed in the present disclosure comprises any flexible material that has a minimum radius of curvature of less than 30 cm. Illustrative examples of flexible materials that can be employed as the optional handle substrate 25 include a metal foil or a polyimide foil.

The optional handle substrate 25 can be used to provide better fracture control and more versatility in handling the spalled portion of the germanium substrate 1. Moreover, the optional handle substrate 25 can be used to guide the crack propagation during the spalling process of the present disclosure. The optional handle substrate 25 of the present disclosure is typically, but not necessarily, formed at room temperature (15° C.-40° C.). The optional handle substrate 25 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, plating, mechanical adhesion, thermocompression bonding or soldering. The optional handle substrate 25 typical has a thickness of from 1 µm to few mm, with a thickness of from 70 µm to 120 µm being more typical. Other thicknesses for the optional handle substrate 18 that are below and/or above the aforementioned thickness ranges can also be employed in the present disclosure.

Figure 3A:
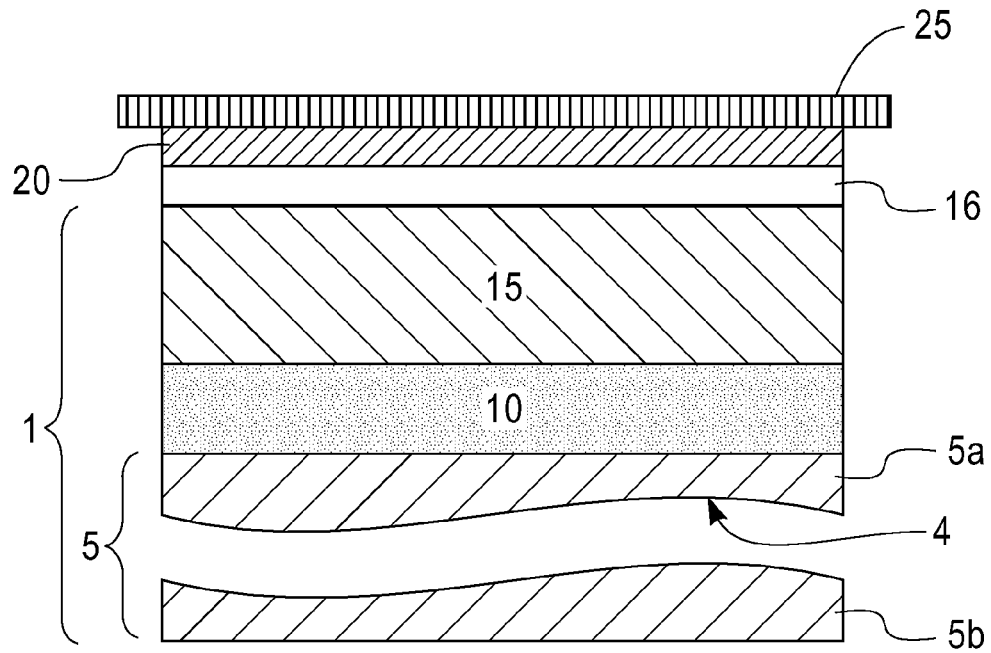
FIGS. 3A and 3B are side cross-sectional views depicting applying a stress from the stressor layer to the germanium substrate, in which the stress cleaves the germanium substrate to provide a cleaved surface, in accordance with one embodiment of the present disclosure.
Figure 3B:
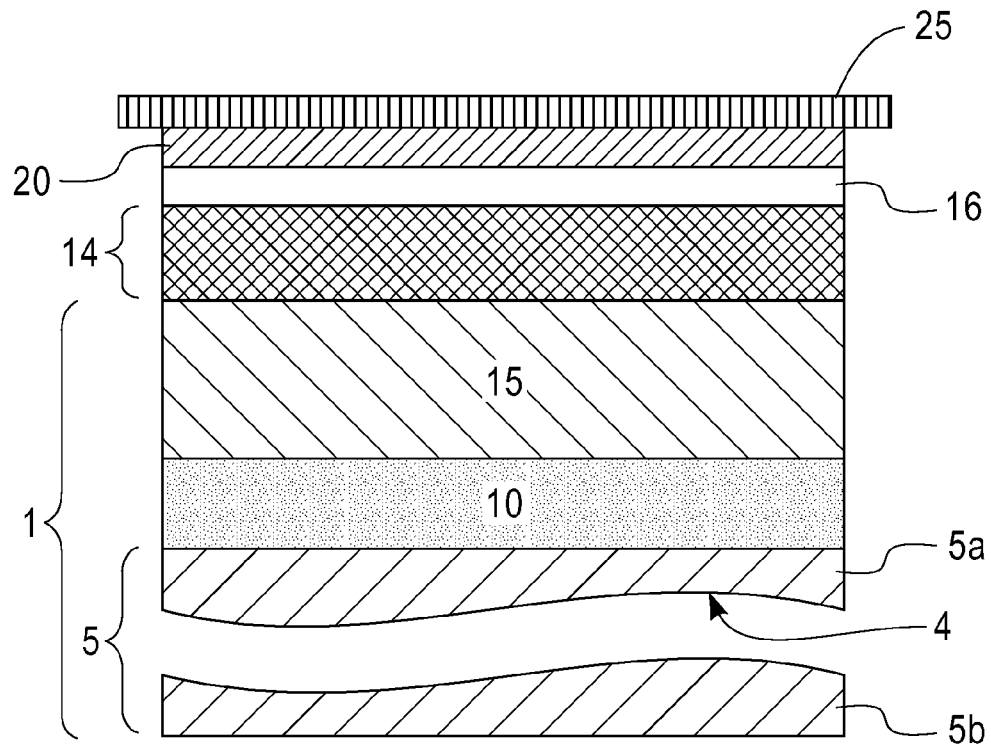

FIGS. 3A and 3B depict applying a stress from the stressor layer 20 to the germanium substrate 1, in which the stress cleaves the germanium substrate 1 to provide a cleaved surface 4 on the remaining portion of the first layer of germanium 5a. FIG. 3A depicts applying a stress to the germanium substrate 1 from a stressor layer 20 that is deposited directly on the germanium substrate 1. FIG. 3B depicts applying a stress to the germanium substrate 1 from a stressor layer 20 that is deposited on a back surface material layer 14 that is present on the germanium substrate 1. The germanium and tin alloy layer 10 is present between the surface that the stressor layer 20 is formed on and the cleaved surface 4 of the germanium substrate 1. In FIGS. 3A and 3B, reference numeral 5a denotes the remaining portion of the first layer of germanium 5 that is attached to the stressor layer 20, while reference numeral 5b denotes the spalled portion of the first layer of germanium 5 that is removed.

The condition that results in spalling of the germanium substrate 1 is related to the combination of the stressor layer 20 thickness value and the stress value for the stressor layer 20, as well as the mechanical properties of the germanium substrate 1. At a given stressor layer 20 thickness value, there will be a stress value above which spalling will occur spontaneously. Likewise, at a given stressor layer 20 stress value, there will be a thickness value above which spalling will occur spontaneously.

An approximate guide for the stressor layer 20 thickness value at which spalling becomes possible for the case where the stressor layer 20 is substantially comprised of tensile stressed Ni is given by the relation $t^*=[(2.5\times10^6)(K_{IC}^{3/2})]/\sigma^2$, where $t^*$ is the thickness value (in units of microns) of the stressor layer 20 at which controlled spalling becomes possible, $K_{IC}$ is the fracture toughness value of the germanium substrate 1 (in units of $MPa*m^{1/2}$), e.g., fracture toughness value of the first layer of germanium 5, and σ is the magnitude of the stress value in the stressor layer 20 (in units of MPa, or megapascals). If the tensile stressed layer 20 thickness is greater than the value given by t* by approximately 50%, then spontaneous spalling may occur. In another aspect, the thickness of the stressor layer 20 may be anywhere from about 1 um to about 50 um, or from about 3 um to about 30 um, or about 4 um to about 20 um thick.

Selection of the stressor layer 20 does not have to be based on the difference between the coefficient of thermal expansion of the stressor layer 20 and the coefficient of thermal expansion of the germanium substrate 1 for promoting spontaneous spalling as in the prior art, where spalling is effected by cooling the structure from an elevated temperature (about 900° C.) to a lower temperature. The present disclosure does not rely on spontaneous spalling, but rather the use of mechanical force, and controlled fracture at substantially room temperature (about 20° C.) to separate layers or layers from the germanium substrate 1, e.g., separate a first portion 5a of the first layer of germanium 5 from the germanium substrate 1. The thickness of the remaining portion 5a of the first layer of germanium 5 that is attached to the stressor layer 20 from the germanium substrate 1 is roughly twice to three times the thickness value of thickness values of stressor layer 20. By controlling the amount of stress in the stressor layer 20, the operable thickness value of stressor layer 20 (t*) can be chosen to remove a controlled thickness of the first layer of germanium 5.

For example, if the thickness of the remaining portion of the germanium substrate 1 after spalling, which includes the second layer of germanium 15, the germanium and tin alloy layer 10, and the remaining portion 5a of the first layer of germanium, is desired to be approximately 10 um, then a stressor layer 20 of nickel would need to be approximately 4 um thick. By using the $K_{IC}$ value for Ge<111> (0.59 MPa*m$^{1/2}$), the expression for t* above can be used to calculate that a stress value of about 600 MPa is required.

Although the origin of the stress in the stressor layer 20 is intrinsic (originating from microstructure), and not due to coefficient of thermal expansion (CTE) stress, heating the stressor layer 20 often has the effect of increasing the stress value. This is due to microstructural changes within the stressor layer 20 that occur upon annealing and is irreversible. Localized heating is therefore contemplated to initiate fracture in the periphery of the area to be layer transferred. In other words, spontaneous spalling can be made to occur in small, selected regions to help initiate fracture, e.g., by increasing the thickness of the stress layer in these small selected regions. Localized heating can be performed using a laser, remote induction heating, or direct contact heating.

The first portion 5a of the first layer of germanium 5 having the cleaved surface 4 that is formed by the controlled spalling process mentioned above typically has a thickness of from 1000 nm to tens of μm, with a thickness of from 5 μm to 50 μm being more typical. The second portion 5b of the first layer of germanium 5 that is removed from the geranium substrate by the spalling process mentioned above typically has a thickness of from 1000 nm to tens of μm, with a thickness of from 5 μm to 50 μm being more typical.

In some embodiments of the present disclosure, the optional handle substrate 25, the stressor layer 20, and the optional metal-containing adhesion layer 16 can be removed from the germanium substrate 1. For example, and in one embodiment, aqua regia ($HNO_3$/HCl) can be used for removing the optional handle substrate 25, the stressor layer 20 and the optional metal-containing adhesion layer 16. In another example, UV or heat treatment is used to remove the optional handle substrate 25, followed by a chemical etch to remove the tensile stressed layer 20, followed by a different chemical etch to remove the optional metal-containing adhesion layer 16.

Figure 4A:
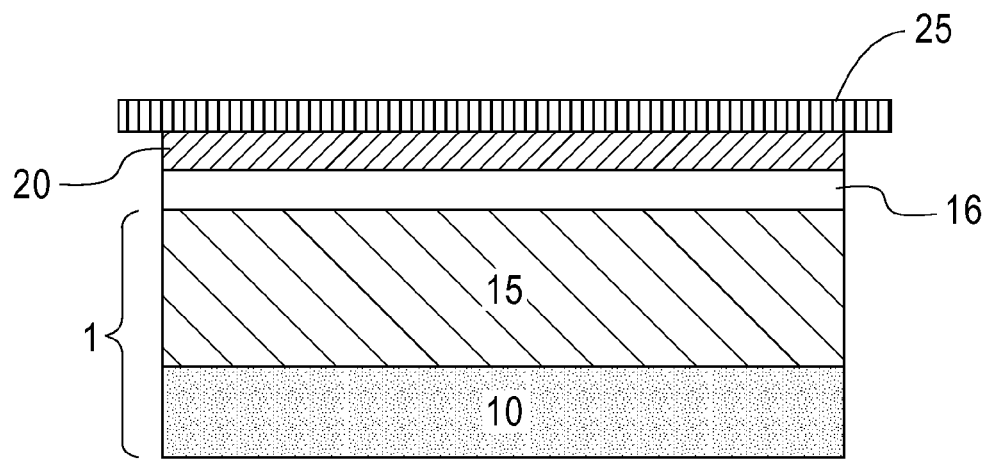
FIGS. 4A and 4B are side cross-sectional views depicting etching the cleaved surface of the germanium substrate selectively to the germanium and tin alloy layer, in accordance with one embodiment of the present disclosure.
Figure 4B:
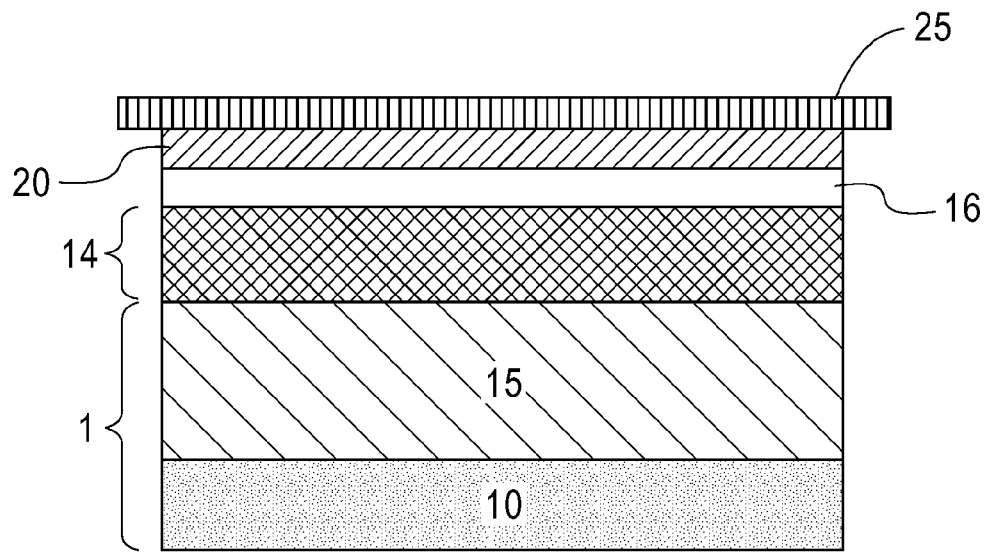

FIGS. 4A and 4B depict some embodiments of etching the cleaved surface 4 of the germanium substrate 1 selectively to the germanium and tin alloy layer 10. FIG. 4A depicts etching the cleaved surface 4 of the structure depicted in FIG. 3A, and FIG. 4B depicts etching the cleaved surface 4 of the structure depicted in FIG. 3B. In some embodiments, the germanium and tin alloy layer 10 functions as an etch stop to remove the cleaved surface 4, and remove variation in thickness in the germanium substrate 1 that results from the cleaved surface 4. As used herein, the term "selective" in reference to a material removal process denotes that the rate of material removal for a first material is greater than the rate of removal for at least another material of the structure to which the material removal process is being applied. In some examples, the selectivity may be greater than 100:1, e.g., 1000:1.

In one embodiment, the etch process that removes the cleaved surface 4 of the remaining portion 5a of the first layer of germanium 5 is a wet etch including an etch chemistry that is selective to the germanium and tin alloy layer 10. In one embodiment, the etch chemistry includes hydrogen peroxide ($H_2O_2$). In another embodiment, the etch chemistry for removing the remaining portion 5a of the first layer of germanium 5 selectively to the germanium and tin layer 10 includes solutions of hydrogen peroxide ($H_2O_2$), hydrofluoric acid (HF) and water ($H_2O$), or dry etching techniques, such as xenon diflouride ($XeF_2$) etching. It is noted that the above etch chemistries have been provided for illustrative purposes only, and are not intended to limit the present disclosure. For example, other etch chemistries may be employed, so long as the etch chemistry removes the remaining portion 5a of the first layer of germanium 5 without removing the germanium and tin alloy layer 10. Other etch processes that can be used at this point of the present disclosure include reactive ion etch, ion beam etching, plasma etching or laser ablation.

Following etching of the cleaved surface 4, and removal of the remaining portion 5a of the first layer of germanium 5, the thickness of the germanium substrate 1, i.e., second layer of germanium 15 and the germanium and tin alloy layer 10, may range from 0.1 microns to 20 microns. In another example, the thickness of the germanium substrate 1, i.e., second layer of germanium 15 and the germanium and tin alloy layer 10, may range from 0.5 microns to 5 microns. The variation of thickness across the entire width of the germanium substrate 1 at this point of the present disclosure is less than 1000 Å.

Figure 5A:
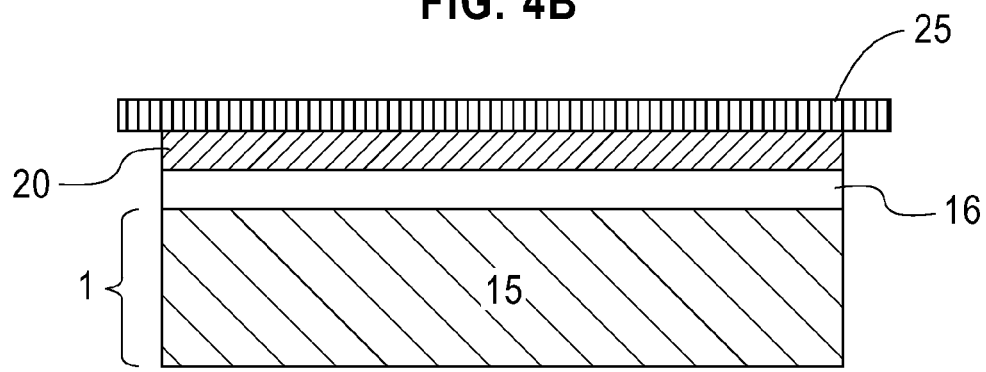
FIGS. 5A and 5B are side cross-sectional views depicting removing the germanium and tin alloy layer, in accordance with one embodiment of the present disclosure.
Figure 5B:
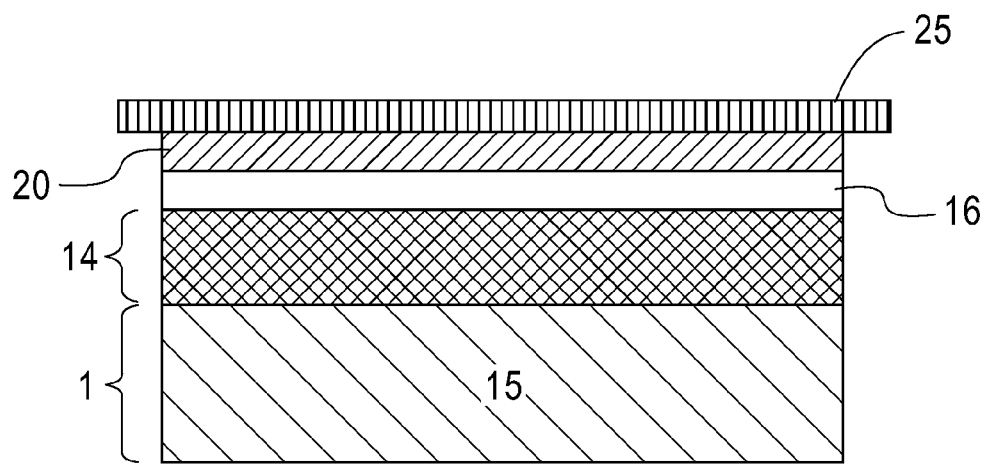

FIGS. 5A and 5B depict some embodiments of removing the germanium and tin alloy layer 10. FIG. 5A depicts removing the germanium and tin alloy layer 10 from the structure depicted in FIG. 4A, and FIG. 5B depicts removing the germanium and tin alloy layer 10 from the structure depicted in FIG. 4B. In one embodiment, the germanium and tin alloy layer 10 is removed selectively to the second layer of germanium 15. In one embodiment, the etch process that removes the germanium and tin alloy layer 10 is a wet etch including an etch chemistry that is selective to the second layer of germanium 15. In one embodiment, the etch chemistry for removing the germanium and tin alloy layer 10 selectively to the second layer of germanium 15 includes Ammonium hydroxide ($NH_4OH$), potassium hydroxide (KOH), tetramethyl ammonium hydroxide (TMAH) and mixtures or dilutions thereof. It is noted that the above etch chemistries have been provided for illustrative purposes only, and are not intended to limit the present disclosure. For example, other etch chemistries may be employed, so long as the etch chemistry removes the germanium and tin alloy layer 10 without removing the second layer of germanium 15. Other etch processes that can be used at this point of the present disclosure include reactive ion etch, ion beam etching, plasma etching or laser ablation.

Following removing the germanium and tin alloy layer 10, the thickness of the germanium substrate 1, i.e., second layer of germanium 15, may range from 0.1 microns to 20 microns. In another example, the thickness of the second layer of germanium 15 may range from 0.5 microns to 5 microns. The variation of thickness across the entire width of the second layer of germanium 15 at this point of the present disclosure is less than 1000 Å.

FIG. 1-5B depict one embodiment of a spalling method in which the germanium and tin alloy layer 10 functions as an etch stop layer to provide a germanium layer having a uniform thickness across its entire width. In another embodiment of the present disclosure, the germanium and tin alloy layer 10 is employed as fracture guiding layers when used in conjunction with controlled spalling technology. In some embodiment, the germanium and tin alloy layer 10 when employed as fracture guiding layers, can be exposed to hydrogen to alter the bonding structure of the germanium and tin alloy layer 10 in order to facilitate facture within the germanium and tin alloy layer 10.

Figure 6A:
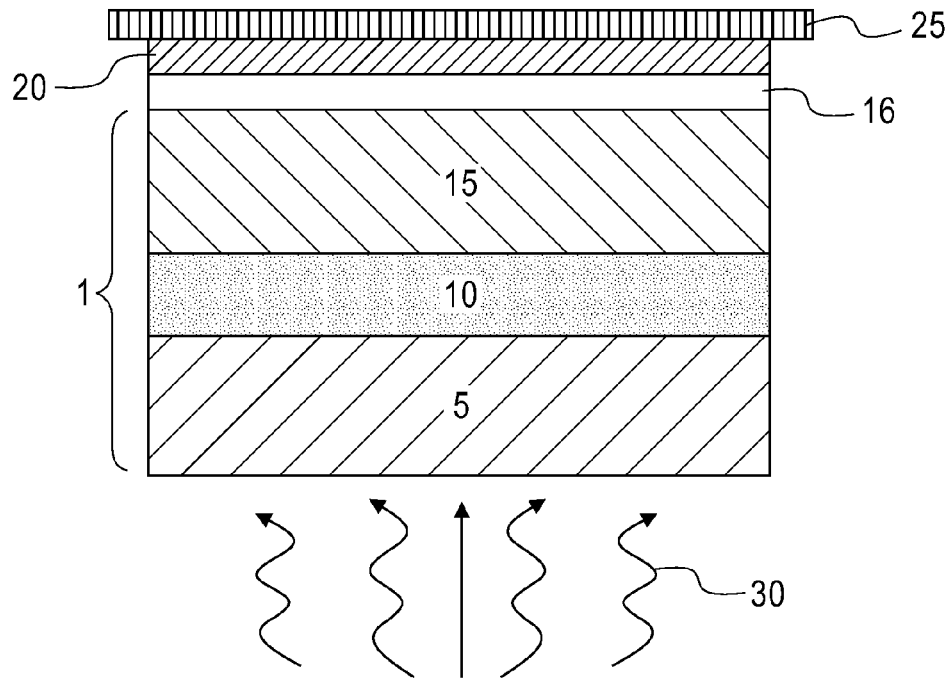
FIGS. 6A and 6B are side cross-sectional views depicting weakening the germanium and tin alloy layer before applying a stress from the stressor layer to the germanium substrate, wherein in this embodiment the germanium and tin alloy layer provides a fracture plane, in accordance with one embodiment of the present disclosure.
Figure 6B:
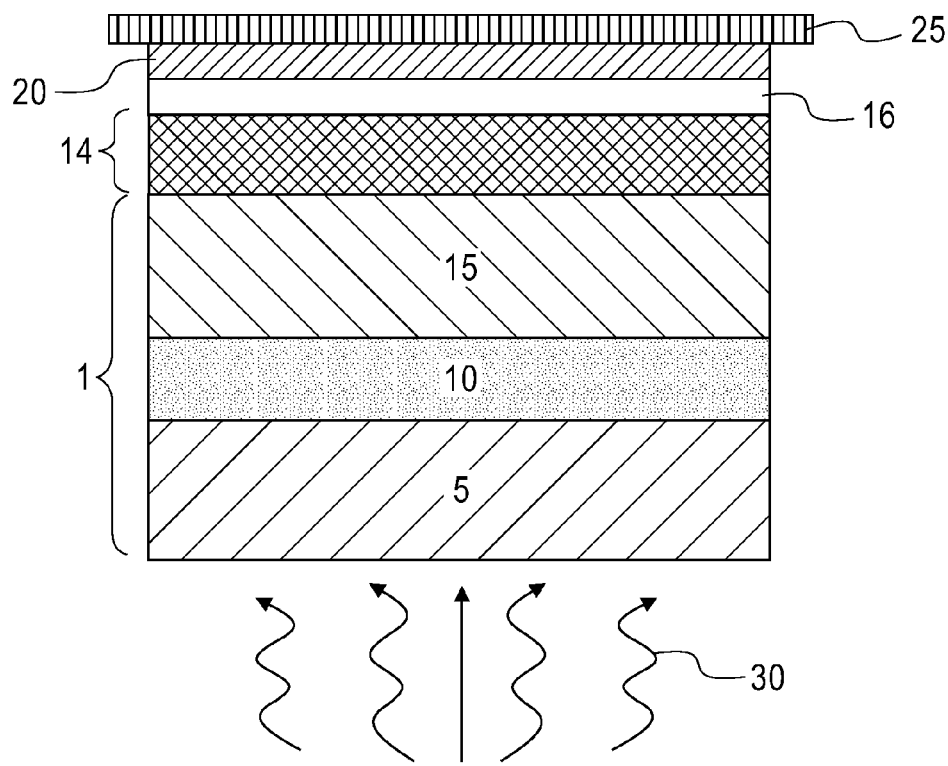

FIGS. 6A and 6B depict some embodiments of depicting weakening the germanium and tin alloy layer 10 before applying a stress from the stressor layer 10 to the germanium substrate 1, wherein in this embodiment the germanium and tin alloy layer 10 provides a fracture plane. The germanium substrate 1 that is depicted in FIGS. 6A and 6B is similar to the germanium substrate 1 that is depicted in FIG. 1. Therefore, the above description of the germanium substrate 1 including the first layer of germanium 5, the germanium and tin alloy layer 10 and the second layer of germanium 15 that are depicted in FIG. 1 is suitable to describe the germanium substrate 1 including the first layer of germanium 5, the germanium and tin alloy layer 10, and the second layer of germanium 15 that are depicted in FIGS. 6A and 6B. Further, the description of the back surface material layer 14, the stressor layer 20, the handling substrate 25, and the optional metal-containing adhesion layer 16 that are depicted in FIGS. 2A and 3B is suitable for the back surface material layer 14, the stressor layer 20, the handling substrate 25, and the optional metal-containing adhesion layer 16 that are depicted in FIGS. 6A and 6B.

In the embodiments in which the germanium and tin alloy layer 10 provides a fracture plane, the composition of the germanium and tin alloy layer 10 is selected so that the germanium and tin alloy layer 10 is under an intrinsic stress. More specifically, the germanium and tin alloy layer 10 is typically a compressively strained material when formed over a germanium material, such as the first layer of germanium 5. When the germanium and tin alloy layer 10 includes silicon, and the silicon is present in the germanium and tin alloy layer 10 in a greater concentration than the tin that is present in the germanium and tin alloy layer 10, the germanium and tin alloy layer 10 is a tensilely strained material. Because Ge(SiSn) ternary alloys with a molar ratio of Si:Sn of approximately 4:1 result in a lattice parameter similar to that of Ge, the most general alloy range that results in compressive stress is given by: $Ge_x(Si_{1-y}Sn_y)_{1-x}$ where $(0 \leq x \leq 1)$ and $(0.2 < y \leq 1)$. Likewise, tensile stress will result when $(0 \leq y < 0.2)$. For example, a tensilely strained germanium and tin alloy layer 10 may include 50 at. % germanium, 5 at. % tin, and 45 at. % silicon. In comparison, a compressively strained germanium and tin alloy layer 10 may include 50 at. % germanium, 15 at. % tin, and 35 at. % silicon.

In one embodiment, the germanium and tin alloy layer 10 is weakened by treating at least one surface of the germanium substrate 1 with a hydrogen containing gas and/or plasma, or a hydrogen containing acid. The treatment of the germanium substrate 1 with the hydrogen containing gas and/or plasma, or a hydrogen containing acid may be conducted prior to depositing of the stressor layer 20 to the germanium substrate 1, or the treatment of germanium substrate 1 with the hydrogen containing gas and/or plasma, or a hydrogen containing acid may be conducted after depositing of the stressor layer 20 to the germanium substrate 1. Similar to the embodiments described above with reference to FIGS. 1-5B, the stressor layer 20 may be deposited directly on the second layer of germanium 15 of the germanium substrate 1, or the stressor layer 20 may be deposited on a back surface material layer 14 that is present on the germanium substrate 1.

In one embodiment, the hydrogen containing gas is hydrogen gas ($H_2$). The hydrogen may be accompanied by a carrier gas, such as argon or helium. In one embodiment, the germanium substrate 1 may be treated with a hydrogen containing plasma. A plasma is a gas in which a majority of the atoms or molecules are ionized. The plasma may be created by RF (AC) frequency, or DC discharge between two electrodes, in which the space between the two electrodes contains hydrogen containing gases. The electrical energy transforms the hydrogen containing gas mixture into reactive radicals, ions, neutral atoms and molecules, and other highly excited species. Chemical reactions are involved in the process, which occur after creation of a plasma of the reacting gases. For example, the atomic and molecular fragments interact with the germanium substrate 1 to introduce hydrogen to the germanium substrate 1. In one embodiment, fractional ionization in plasmas used for deposition and related materials processing varies from $10^{-4}$, in typical capacitive discharges, to as high as 5-10%, in high density inductive plasmas. Plasmas are typically operated at pressures of a few millitorr, e.g., 1 millitorr to 10 millitorr, to a few torr, e.g., 1 torr to 10 torr, although arc discharges and inductive plasmas can be ignited at atmospheric pressure. The plasma may be provided by radio-frequency capacitive discharge, inductively coupled plasma (ICP), electron cylclotron resonance (ECR), and helicon waves. In the embodiments, in which the germanium substrate is treated with a hydrogen containing acid, the hydrogen containing acid may be provided by hydrofluoric acid (HF), hydrochloric acid (HCl) or sulphuric acid. It is also contemplated that hydrogenation or deuteration be performed at high pressures (such as many atmoshperes) to increase transport of hydrogen into the substrate.

Following treatment with the hydrogen containing gas and/or plasma, or the hydrogen containing acid, the hydrogen diffuses to the bonds within the intrinsically stressed germanium and tin alloy layer 10, wherein the interaction between the hydrogen and the bonds of the germanium and tin alloy layer 10 weakens the bonding within the germanium and tin alloy layer 10.

Figure 7A:
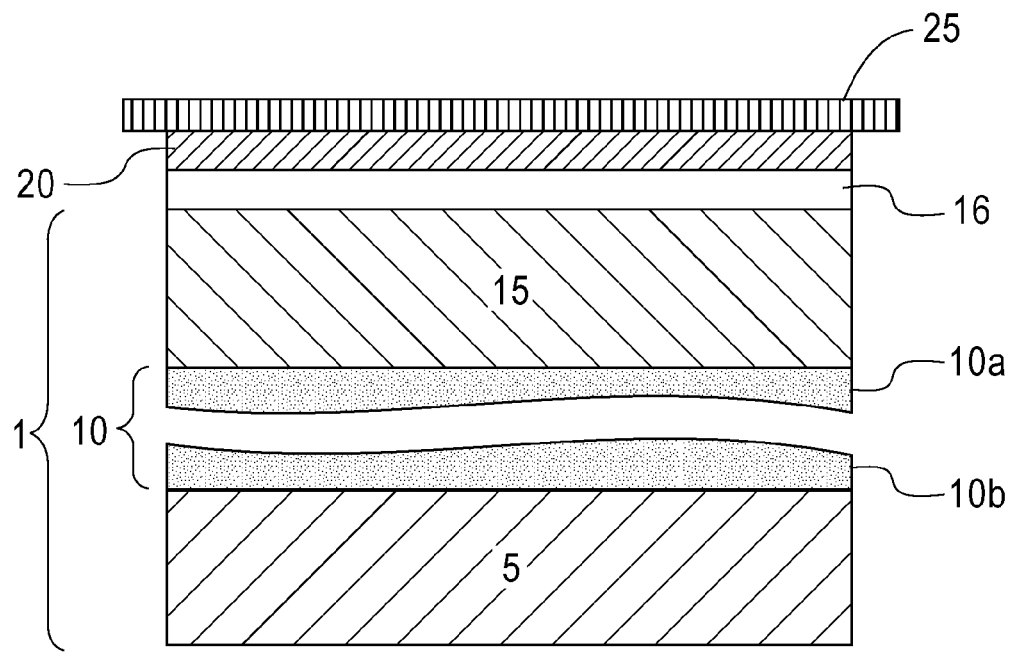
FIGS. 7A and 7B are side cross-sectional views depicting applying a stress from the stressor layer to the germanium substrate depicted in FIGS. 6A and 6B, in which the stress cleaves the germanium substrate along the germanium and tin alloy layer, in accordance with one embodiment of the present disclosure.
Figure 7B:
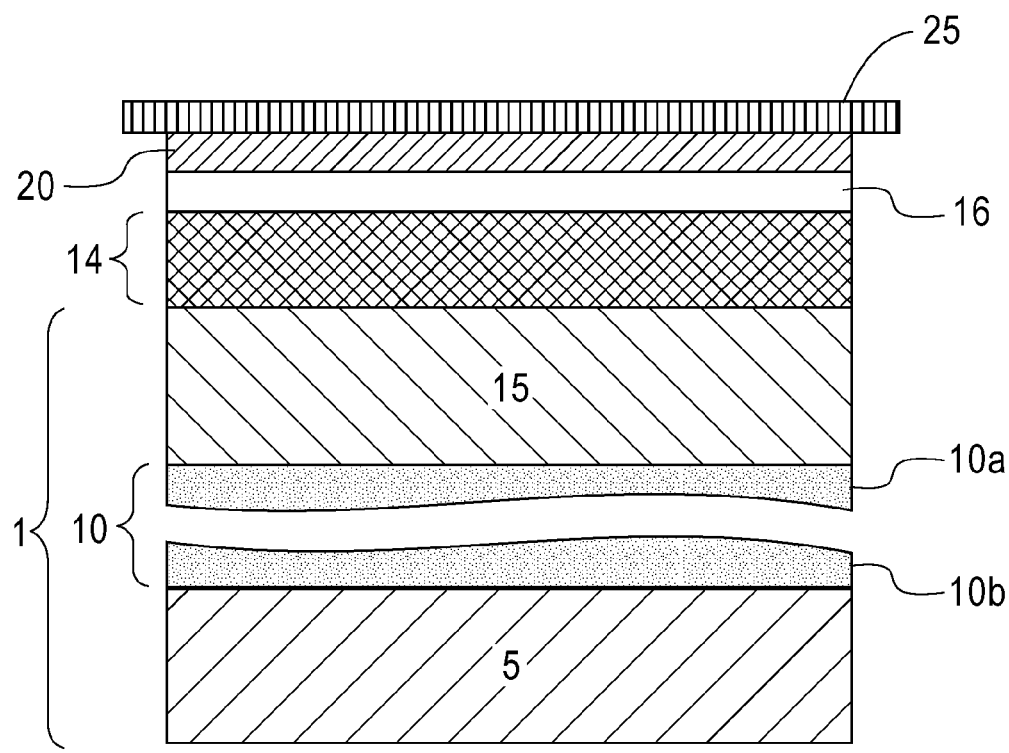

FIGS. 7A and 7B depict some embodiments of applying a stress from the stressor layer 20 to the germanium substrate 1 depicted in FIGS. 6A and 6B, in which the stress cleaves the germanium substrate 1 along the germanium and tin alloy layer 10. The applying of the stress by the tensile stressed layer 20 to the germanium substrate 1 that is depicted in FIGS. 7A and 7B is similar to the method of applying the stress to the germanium substrate 1 using the stressor layer 20 that is described above with reference to FIGS. 2A and 2B, with the exception that in the method depicted in FIGS. 7A and 7B the germanium substrate 1 cleaves along the germanium and tin alloy layer 10.

Figure 8A:
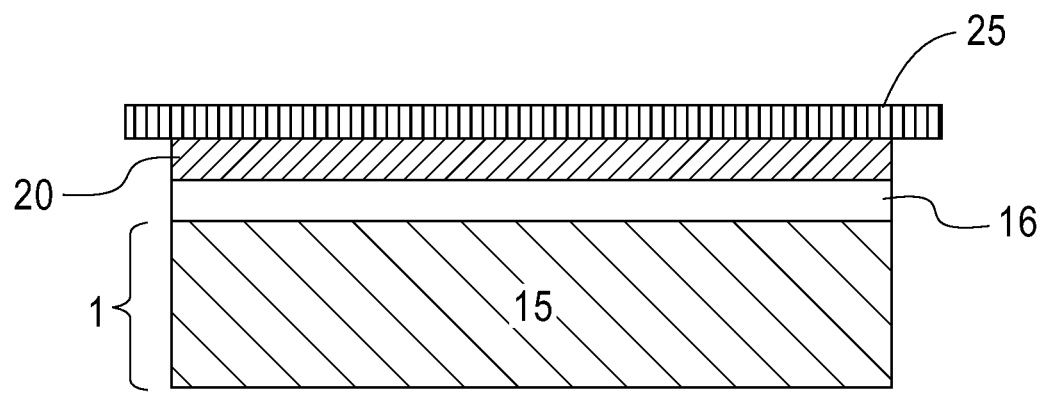
FIGS. 8A and 8B are side cross-sectional views depicting removing the remaining portion of germanium and tin alloy layer from the structure depicted in FIGS. 7A and 7B, in accordance with one embodiment of the present disclosure.
Figure 8B:
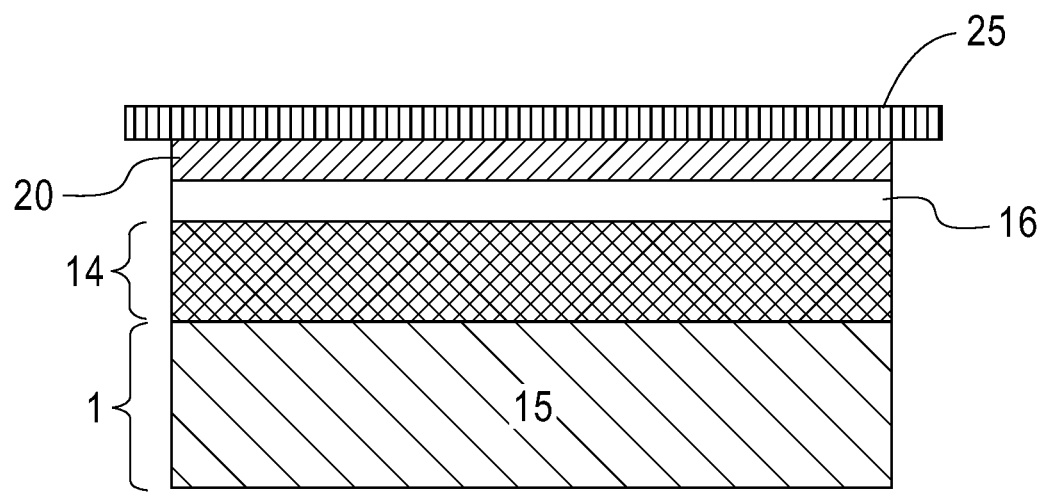

FIGS. 8A and 8B depict some embodiments of removing the remaining portion 10a of germanium and tin alloy layer 10 from the structure depicted in FIG. 7. In one embodiment, the remaining portion 10a of the germanium and tin alloy layer 10 is removed selectively to the second layer of germanium 15. In one embodiment, the etch process that removes the remaining portion 10a of the germanium and tin alloy layer 10 is a wet etch including an etch chemistry that is selective to the second layer of germanium 15. In one embodiment, the etch chemistry for removing the remaining portion 10a of the germanium and tin alloy layer 10 selectively to the second layer of germanium 15 includes ammonium hydroxide ($NH_4OH$), potassium hydroxide (KOH), tetramethyl ammonium hydroxide (TMAH) and mixtures or dilutions thereof. It is noted that the above etch chemistries have been provided for illustrative purposes only, and are not intended to limit the present disclosure. For example, other etch chemistries may be employed, so long as the etch chemistry removes the germanium and tin alloy layer 10 without removing the second layer of germanium 15. Other etch processes that can be used at this point of the present disclosure include reactive ion etch, ion beam etching, plasma etching or laser ablation.

Following removing the germanium and tin alloy layer 10, the thickness of the germanium substrate 1, i.e., second layer of germanium 15, may range from 0.1 microns to 20 microns. In another example, the thickness of the second layer of germanium 15 may range from 0.5 microns to 10 microns. The variation of thickness across the entire width of the second layer of germanium 15 at this point of the present disclosure is less than 1000 Å.

Figure 9A:
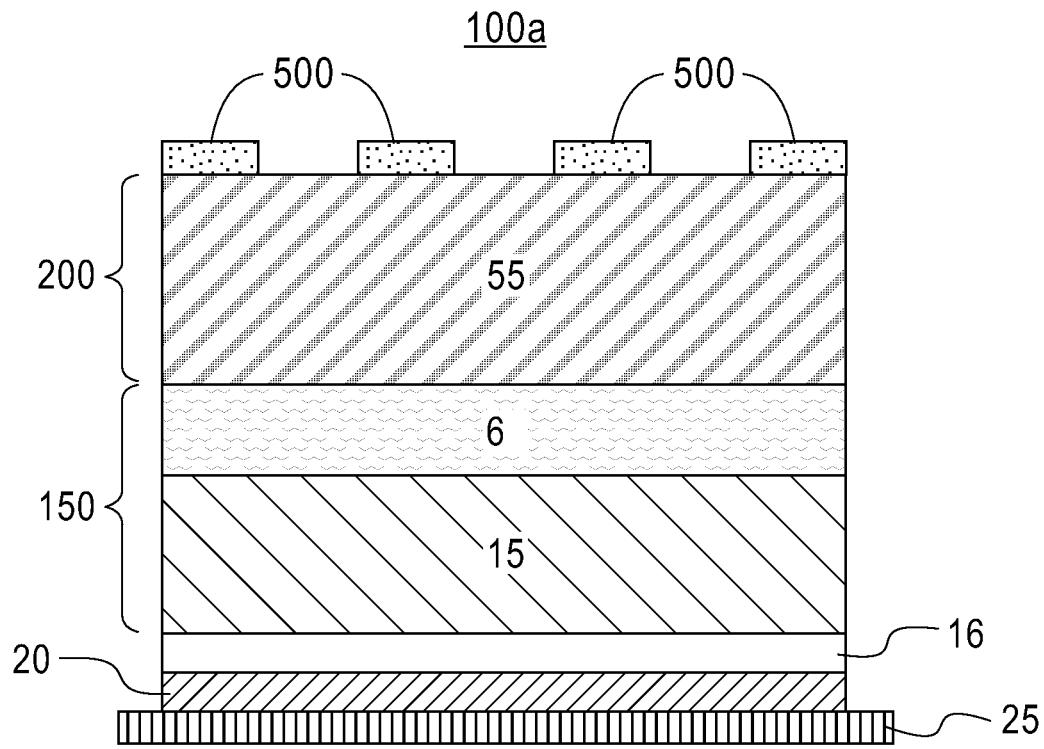
FIGS. 9A and 9B are a side cross-sectional view depicting forming a photovoltaic device on the remaining portion of the germanium substrate that results from the method sequences that are depicted in FIGS. 1-8B, in accordance with one embodiment of the present disclosure.

The methods described above can be used in fabricating various types of thin-film devices including, but not limited to, semiconductor devices, and photovoltaic devices. FIG. 9A depicts one embodiment of forming a photovoltaic device 100a on the remaining portion of the germanium substrate 1 that results from the method sequence that is depicted in FIGS. 1-8A.

FIG. 9A depicts one embodiment of a photovoltaic device 100a, such as a multi-junction III-V photovoltaic cell, that includes a second layer of germanium 15 (hereafter referred to as layer of germanium 15) having a thickness ranging from 1 micron to 10 microns, wherein the layer of germanium 15 has a variation of thickness across the entire width of the first layer of germanium that is less than 1000 Å. The layer of germanium 15 may be provided by the at least one of the spalling methods that are described above with reference to FIGS. 1-8A, and provide at least one component of the bottom cell 150 of the photovoltaic device 100a. The layer of germanium 15 typically has a first conductivity, and a semiconductor layer 6 is typically formed atop the layer of germanium 15 having a second conductivity that is opposite the first conductivity. For example, if the layer of germanium 15 is doped to a p-type conductivity, the semiconductor layer 6 is doped to an n-type conductivity, and vice versa. The semiconductor layer 6 may be composed of a silicon containing material or of a germanium containing material. The semiconductor layer 6 may be an epitaxially deposited layer. Examples of CVD processes suitable for forming the semiconductor layer 6 include Atmospheric Pressure CVD (APCVD), Low Pressure CVD (LPCVD), Plasma Enhanced CVD (PECVD), Metal-Organic CVD (MOCVD), Ultra-high vacuum CVD (UHV-CVD) and combinations thereof. The combination of the layer of germanium 15 and the semiconductor layer 6 may provide the bottom cell 150 of the photovoltaic device 100a. The bottom cell 150 of the photovoltaic device may have a thickness of 10 microns or less.

In one embodiment, the photovoltaic device 100a includes at least one top cell 200 comprised of at least one III-V semiconductor material that is present in direct contact with a bottom cell 150 that is comprised of a germanium containing material. The at least one top cell 200 is composed of any number of layers of any number of III-V semiconductor materials. A "III-V semiconductor material" is an alloy composed of elements from group III and group V of the periodic table of elements. In one embodiment, the at least one top cell 200 is comprised of at least one III-V semiconductor material selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Each of the III-V semiconductor materials that provide the at least one top cell 200 may have a single crystal, multi-crystal or polycrystalline crystal structure. Each of the III-V semiconductor materials may be epitaxial. To provide a junction with each of the cells in the at least one top cell 200 and to provide a junction with the bottom cell 150, the III-V semiconductor materials may be doped to a p-type or n-type conductivity. The effect of the dopant atom, i.e., whether it is a p-type or n-type dopant, depends occupied by the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. Each of the layers in the at least one top cell 200 that provide PN junctions may have a thickness ranging from 100 nm to 6,000 nm. In another embodiment, each of the layers in the at least one top cell 20 may have a thickness ranging from 500 nm to 4,000 nm.

Still referring to FIG. 9A, front contacts 500 may then be formed in electrical communication with at least the at least one top cell 200 of at least one III-V semiconductor material. The front contacts 500 may be deposited with a screen printing technique. In another embodiment, the front contacts 500 are provided by the application of an etched or electroformed metal pattern. The metallic material used in forming the metal pattern for the front contacts 500 may include applying a metallic paste. The metallic paste may be any conductive paste, such as Al paste, Ag paste or AlAg paste. The metallic material used in forming the metal pattern for the front contact 500 may also be deposited using sputtering or plating. In some embodiments, the back contact may be provided by the stressor layer 20, when the stressor layer 20 is composed of a conductive material, such as a metal. In other embodiments, the back contact may be formed using similar methods and materials as the front contacts 500.

Figure 9B:
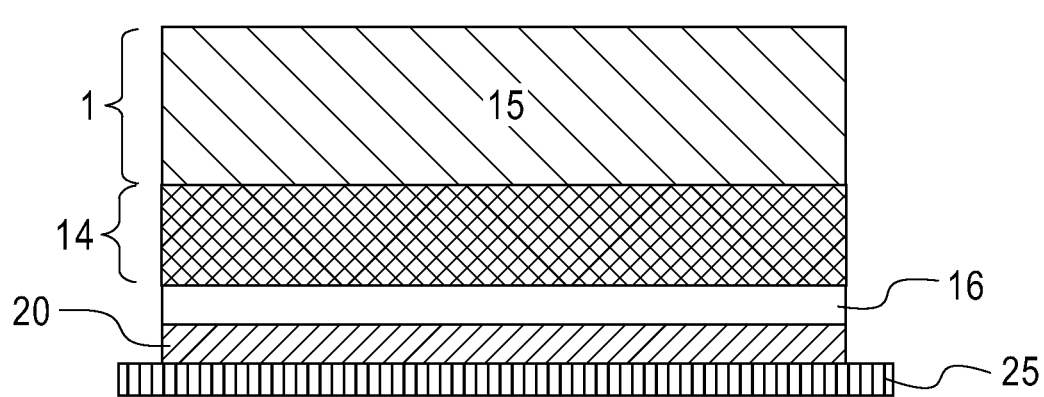

FIG. 9B depicts one embodiment of a photovoltaic device 100b that results from the method sequences that is depicted in FIGS. 1-8B.

The photovoltaic structure 100a, 100b depicted in FIGS. 9A and 9B is provided for illustrative purposes only and is not intended to limit the present disclosure, as other photovoltaic structures are within the scope of the present disclosure. For example, the photovoltaic structure that is depicted in FIGS. 9A and 9B may further include tunneling layers, reflector layers, anti-reflective layers, and transparent conductive oxide layers. In another example, an intrinsic semiconductor layer is present between the layer of germanium 15 and the semiconductor layer 6, and the photovoltaic device is a p-i-n solar cell.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A method of cleaving a semiconductor material comprising:
   providing a germanium substrate comprising a first layer of germanium, a germanium and tin alloy layer present on the first layer of germanium, and a second layer of germanium present on the germanium and tin alloy layer;
   depositing a stressor layer on the second layer of germanium of the germanium substrate;
   applying a stress from the stressor layer to the germanium substrate, in which the stress cleaves the first layer of germanium of the germanium substrate to provide a cleaved surface, wherein the germanium and tin alloy layer is present between the second layer of germanium and the cleaved surface of a remaining portion of the first layer of germanium; and
   etching the cleaved surface to remove the remaining portion of the first layer of germanium selective to the germanium and tin alloy layer, wherein a remaining portion of the germanium substrate comprising the second layer of germanium and the germanium and tin layer has a uniform thickness across an entire width of the remaining portion of the germanium substrate.

2. The method of claim 1, wherein the germanium and tin alloy layer comprises 0.5% at. to 20 at. % tin, less than 50 at. % silicon, and a remainder of germanium.

3. The method of claim 2, wherein the silicon content of the germanium and tin alloy layer is selected to offset the stress induced by the tin content of the germanium and tin alloy layer.

4. The method of claim 3, wherein at least one of a back surface field layer, a back surface passivation layer, a tunnel layer, or a back solar cell junction is formed on a back surface of the first layer of germanium that is opposite the surface of the first layer of germanium that the germanium and tin alloy layer is formed on, wherein the at least one of the back surface field layer, the back surface passivation layer, the tunnel layer, or the solar cell junction provides a surface of the germanium substrate that the stressor layer is deposited on.

5. The method of claim 3, further comprising removing the germanium and tin alloy layer selective to the second layer of germanium, wherein a thickness variation across an entire width of the second layer of germanium is less than 1000 Å.

6. The method of claim 1, wherein the first layer of germanium comprises a base material of 100% germanium, and the second layer of germanium comprises a base material of 100% germanium.

7. The method of claim 1, wherein the forming of the germanium and tin alloy layer comprises molecular beam epitaxy from germanium and tin solid source materials, chemical vapor deposition from at least a germanium-containing source gas and a tin-containing source gas, or a combination thereof.

8. The method of claim 7, wherein the tin-containing source gas comprises stannane ($SnH_4$), Stannane-d4 ($SnD_4$) or a combination thereof.

9. The method of claim 1, wherein the stressor layer is comprised of a metal containing layer, a polymer layer, an adhesive tape or a combination thereof.

10. The method of claim 1, wherein the depositing of the stressor layer on the germanium substrate comprises an adhesive connection of a metal containing layer onto the germanium substrate.

11. The method of claim 1, further comprising a handling substrate that is bonded to a surface of the stressor layer that is opposite a surface of the stressor layer that is deposited on the germanium substrate.

12. The method of claim 1, wherein the applying of the stress from the stressor layer to the germanium substrate comprises a mechanical force applied to the stressor layer that produces a stress in the germanium substrate, or a temperature change applied to the stressor layer that produces a thermal expansion differential with the germanium substrate to provide a stress in the germanium substrate, wherein the stress in the germanium substrate that results from the mechanical force or temperature change that is applied to the stressor layer causes crack propagation within the first layer of germanium of the germanium substrate and provides the cleaved surface.

13. The method of claim 1, wherein the etching of the cleaved surface to remove the remaining portion of the first layer of germanium that is selective to the germanium and tin alloy layer of the germanium substrate comprises a wet etch comprised of hydrogen peroxide.

14. A method of cleaving a semiconductor material comprising:
    providing a germanium substrate comprising a first layer of germanium, a germanium and tin alloy layer present on the first layer of germanium, and a second layer of germanium present on the germanium and tin alloy layer;
    weakening the germanium tin alloy layer;
    depositing a stressor layer on the germanium substrate; and
    applying a stress from the stressor layer to the germanium substrate, in which the stress cleaves the germanium substrate along the germanium and tin alloy layer.

15. The method of claim 14, wherein the germanium and tin alloy layer comprises 0.5 at. % to 20 at. % tin, less than 50% silicon, and a remainder of germanium.

16. The method of claim 14, wherein the silicon content of the germanium and tin alloy layer is selected to provide a tensile stress in the germanium and tin alloy layer or the tin content of the germanium and tin alloy layer is selected to provide a compressive stress.

17. The method of claim 14, wherein the weakening of the germanium and tin alloy layer comprises treating the germanium substrate with a hydrogen containing gas, a hydrogen containing acid or a combination thereof, wherein hydrogen from the hydrogen containing gas, the hydrogen containing acid or the combination thereof diffuses to the germanium and tin alloy layer to weaken bonding within the germanium and tin alloy layer.

18. The method of claim 14, wherein the applying of the stress from the stressor layer to the germanium substrate comprises a mechanical force applied to the stressor layer that produces a stress in the germanium substrate, or a temperature change applied to the stressor layer that produces a thermal expansion differential with the germanium substrate to provide a stress in the germanium substrate, wherein the stress in the germanium substrate that results from the mechanical force or temperature change that is applied to the stressor layer causes crack propagation along the germanium and tin alloy layer and cleaves the germanium substrate.

19. The method of claim 14 further comprising etching a remaining portion of the germanium tin alloy layer selectively to the second layer of germanium, wherein a thickness variation across an entire width of the second layer of germanium is less than 1000 Å.

* * * * *